United States Patent [19]

Taylor et al.

[11] Patent Number: 4,862,018

[45] Date of Patent: Aug. 29, 1989

[54] NOISE REDUCTION FOR OUTPUT DRIVERS

[75] Inventors: Ronald T. Taylor, Grapevine; George A. Giles, Plano; Doran David, Dallas, all of Tex.

[73] Assignee: Texas Instruments Incorporated, Dallas, Tex.

[21] Appl. No.: 126,539

[22] Filed: Nov. 30, 1987

[51] Int. Cl.[4] .................... H03K 17/16; H03K 17/687
[52] U.S. Cl. .................... 307/443; 307/572; 307/575; 307/475; 307/557; 307/296.5
[58] Field of Search .................... 307/443, 451, 296.8, 307/296.5, 304, 475, 572, 573, 270; 328/162

[56] References Cited

U.S. PATENT DOCUMENTS

| | | | |
|---|---|---|---|
| 3,651,340 | 3/1972 | Cliff | 307/451 |
| 4,305,009 | 12/1981 | Miyagawa et al. | 307/475 |
| 4,329,600 | 5/1982 | Stewart | 307/270 |
| 4,567,378 | 1/1986 | Raver | 307/270 |
| 4,612,466 | 9/1986 | Stewart | 307/270 |

Primary Examiner—John S. Heyman
Assistant Examiner—Richard Roseen
Attorney, Agent, or Firm—Michael E. Melton; Leo N. Heiting; Melvin Sharp

[57] ABSTRACT

High current capacity output drivers for digital devices have output noise reduced and more quickly achieve stability by the insertion of resistance in series with inherent, parasitic inductance. The resistance may be one or more fixed resistances formed in the same circuit as the drivers. The resistance may also include sensor devices that selectively increase the resistance of the output drivers in accordance with the voltage produced by the parasitic inductors. Both fixed resistances and sensor devices may be used together.

26 Claims, 3 Drawing Sheets

ALL INDUCTANCES ARE PARASITIC

NOISE REDUCTION FOR OUTPUT DRIVERS

FIELD

This invention relates to output drivers, and, in particular, to a noise reduction technique for CMOS output drivers.

BACKGROUND

An output driver is used to connect a digital signal to a load and to provide enough current for the digital signal to drive the load. The digital signal may be provided as the output signal of a digital device such as a memory device, a logic circuit, a microprocessor, or a gate array. In a common prior art static random access memory (SRAM) the output is connected to a pair of complementary metal oxide (CMOS) transistors. The CMOS drivers are, in effect, current amplifiers for the low current digital outputs of a memory device. The CMOS drivers boost the current of the digital output of the memory device from typically a few milliamps to enough, typically many 10s of milliamps, to drive the desired load, such as another device or an input to a display. Current gains of 100 (during switching) are common in these applications.

In the past designers of driver circuits have been able to neglect the effect of parasitic inductance. This inductance is generated by the wires and other current path connections disposed between the digital circuit and the externally applied signals (including power supplies), and between the driver and the load. Such neglect is acceptable so long as the current switched by the driver at the load is low and the propagation delay through the device is much greater than any parasitic LC time constant associated with drivers and power supplies. However, larger driving currents are required since load circuits have increased in size and the parasitic inductance can no longer be ignored.

Parasitic inductance slows down the effective speed of the drivers. Such inductance introduces an unwanted oscillation in the output of the drivers and in driver power supply wiring. This oscillation is caused by an effective LC circuit that exists in the connection between the inherent or parasitic inductances and the capacitance of the load. The output of the driver will not be a valid output level until the oscillations have decayed to a level below that rated output level. To achieve that level, others have simply used smaller output drivers, or delay turning on the output to dampen the oscillations. However, faster output responses require larger drivers to handle more current in less time. Such large currents result in either extended oscillations that slow down the valid output or result in an unstable, oscillating output.

SUMMARY

The invention provides an improved output driver circuit for a high speed digital device. It reduces the noise or undesired output oscillations by providing small valued resistors in the power supply leads connected to the output drivers. These small resistors can be integrated directly on the same circuit as the output drivers. The invention further provides a pair of voltage sensing metal-oxide field effect transistors (MOSFET). These MOSFETs are connected to the output driver pair of CMOS devices for sensing when the inductive voltage exceeds a predetermined level. Upon exceeding that level, the MOSFETs will momentarily reduce the drive of the output drivers. The MOSFET contribution is enhanced by a further resistance in the output buffer that enhances the effect of the voltage sensing MOSFETs.

In one embodiment both enhancements are used. The added resistance adds a minimal (about one nanosecond) delay to the output transition. However, the added resistance reduces the amplitude of the oscillations enough so that the overall speed of the output in achieving stability is still within acceptable limits. The MOSFET voltage sensors further dampen the output without compromising speed.

DRAWING

DETAILED DESCRIPTION

Figure 1:
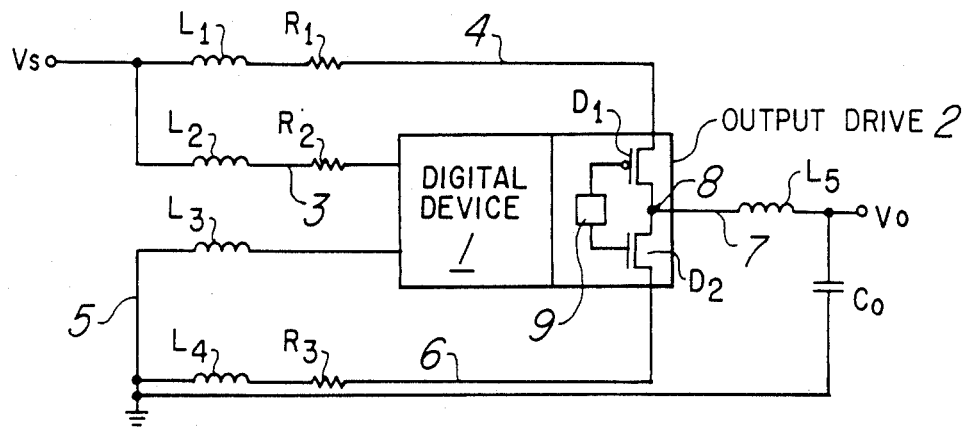
FIG. 1 is a combined block diagram and schematic representation of the invention.

Turning to FIG. 1 there is shown a digital signal device 1 coupled to and output driver 2. The output driver 2 has a pair of driving transistors D1, D2. A voltage source, Vs provides power to the digital device 1 and the output driver 2. The wires and other connections between the source Vs inherently produce inductance on the power supply lines 3,4 that connect Vs, respectively, to digital device 1 and output driver 2. Such parasitic inductance is represented by inductors L1 on supply line 4 and L2 on supply line 3.

A corresponding pair of parasitic inductors L3,L4 appear on the ground lines 5,6. A parasitic inductance L5 appears on the output line 7 between the output node 8 and a load represented by a capacitor $C_o$. Any load will have some capacitance and it is important to dampen the oscillations produced by the inherent combination of parasitic inductors L1–L5 and the load capacitance $C_o$.

The invention provides fixed resistances connected to selected parasitic inductances. These fixed resistances function to dampen the oscillations of the output and power supplies. In FIG. 1 the fixed resistance comprises three resistors R1,R2,R3. One resistor R1 is disposed on the supply line 4; another resistor R2 is provided on supply line 3; a further resistor R3 is placed on the ground line 6.

The output driver 2 includes control logic 9 that is shown in more detail in FIGS. 2 and 3 and will be more fully described later. Control logic 9 receives a low current digital output signal from digital device 1 and selectively applies that signal to turn on either D1 or D2. D1 is turned on when the desired output is high; D2 is turned on when the desired output is low. Output node 8 carries a output current signal corresponding to the output of digital device 1. The current out of node 8 to the load $C_o$ is substantially greater than the output current of digital device 1.

In operation, control logic 9 will switch from one of drivers D1,D2 to the other upon receipt of a change in the signal output from the digital device 1. Let one assume that at the time the drivers D1,D2 switch the capacitance $C_o$ is charged. To change the output state D1 is turned off and D2 is turned on. The charge on the capacitance $C_o$ will discharge through parasitic inductors L5 and L4 and resistance R3. D2 is a high current device that can rapidly change state from conducting to nonconducting. Hence D2 offers little or no resistance to the current from capacitance $C_o$. But for resistance R3, the only impedance seen by the current is an LC circuit of the load capacitance $C_o$ and L4,L5. Such a circuit will be unstable and will oscillate for a long time until the output decays to a acceptable level. However, the effect of R3 is to dampen the amplitude of the oscillations and quickly bring the output to an acceptable level.

Figure 4:
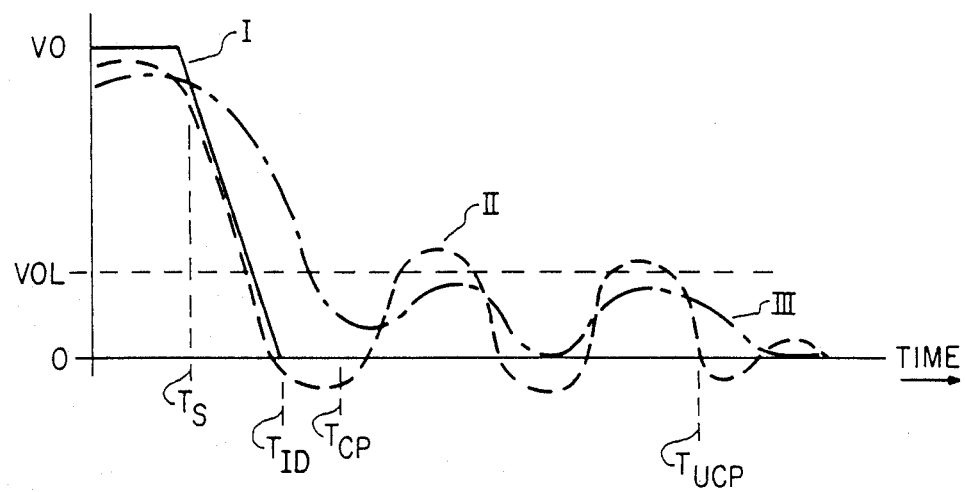
FIG. 4 is a graph comparing performance of a piecewise linear model of an ideal circuit (curve I), a circuit with large current drivers but no control of the parasitic impedance (curve II) and a circuit with the resistance and MOSFET enhancements of the invention (curve III).

The operation of the invention as shown in FIG. 1 is shown by comparison to an ideal response and to response of the circuit without resistance coupled to the parasitic inductance by the curves of FIG. 4. Curve I is a piecewise linear model of an ideal response without parasitic inductance. Upon switching at time Ts the output will rapidly fall to zero and will remain there from time Tid. When large drivers D1,D2 are used without compensating resistance, the result is an output that follows curve II. The amplitude initially decreases, but the output does not reach a stable state, i.e. less than VOL, for a number of oscillations, at a time Tucp.

The inventive circuit follows curve III. As D2 is switched on the output Vo begins to fall. The fall is not as rapid as the ideal, curve I, or as the uncompensated case, curve II. However, the presence of the resistance R3 so dampens the amplitude of the oscillations that the output achieves stability at a time Tcp which is substantially sooner than the uncompensated circuit of curve II.

In the embodiment of FIG. 1 the resistances R1–R3 may be fixed resistances that are formed integrally with drivers D1, D2 on an integrated circuit or in power supply wiring leading to these drivers. Another feature of the invention is the provision of a pair of sensor devices that can effectively, momentarily increase the resistance of the drivers D1, D2 at a time when the rate of change of output current is excessive. At such a time the parasitic inductances will have their most impact at generating opposing voltages. By selectively increasing the resistance at such time the influence of the inductance on the output can be reduced.

Figure 2:
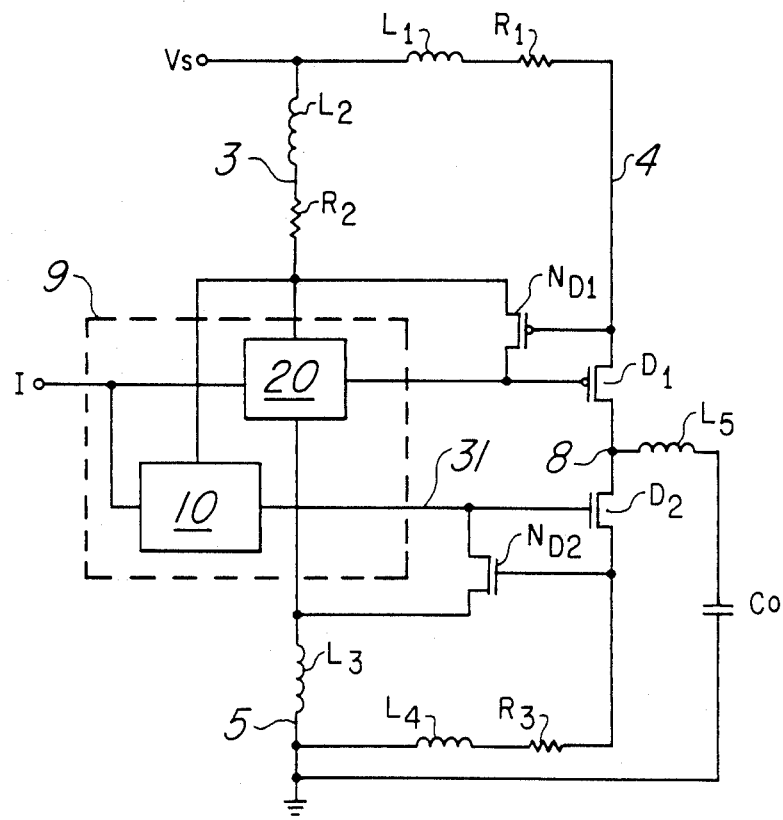
FIG. 2 is a block diagram of the output driver.

FIG. 2 shows the inventive feature for selectively increasing the resistance of the output drivers D1, D2 as a function of inductive voltage. A pair of sensor devices in the form of MOSFET transistors ND1 and ND2 are provided. ND1 has its gate connected to the source/drain line of D1; ND2 has its gate connected to the source/drain line of D2. The source/drain line of ND1 is connected between the power supply line 3 and the gate of D1; the source/drain line of ND2 is connected between the gate of D2 and the ground line 5.

Control logic 9 is shown as comprising one logic circuit 20 for controlling D1 and another logic circuit 10 for controlling D2. The sensor devices ND1,ND2 are normally off. Each is turned on by a voltage applied to its gate as a result of the appropriate inductance and fixed resistance. The inductive voltage turns on the correct sensor devices ND1 or ND2. Once on, the source/drain path of the device shunts the output current of logic circuits 10 or 20 to the appropriate power supply changing the gate voltage on driver D1, or D2. This voltage change is sufficient to increase the resistance of D1 and D2 to current passing through the source/drain of each. In fact, D1 or D2 may be momentarily turned off. In either case, the net effect is to prevent further increase in the current in the inductance or otherwise reduce the rate of change of current through the inductance. Accordingly, the amplitude of the oscillations will be reduced and the drivers D1, D2 will rapidly achieve stability.

Figure 3:
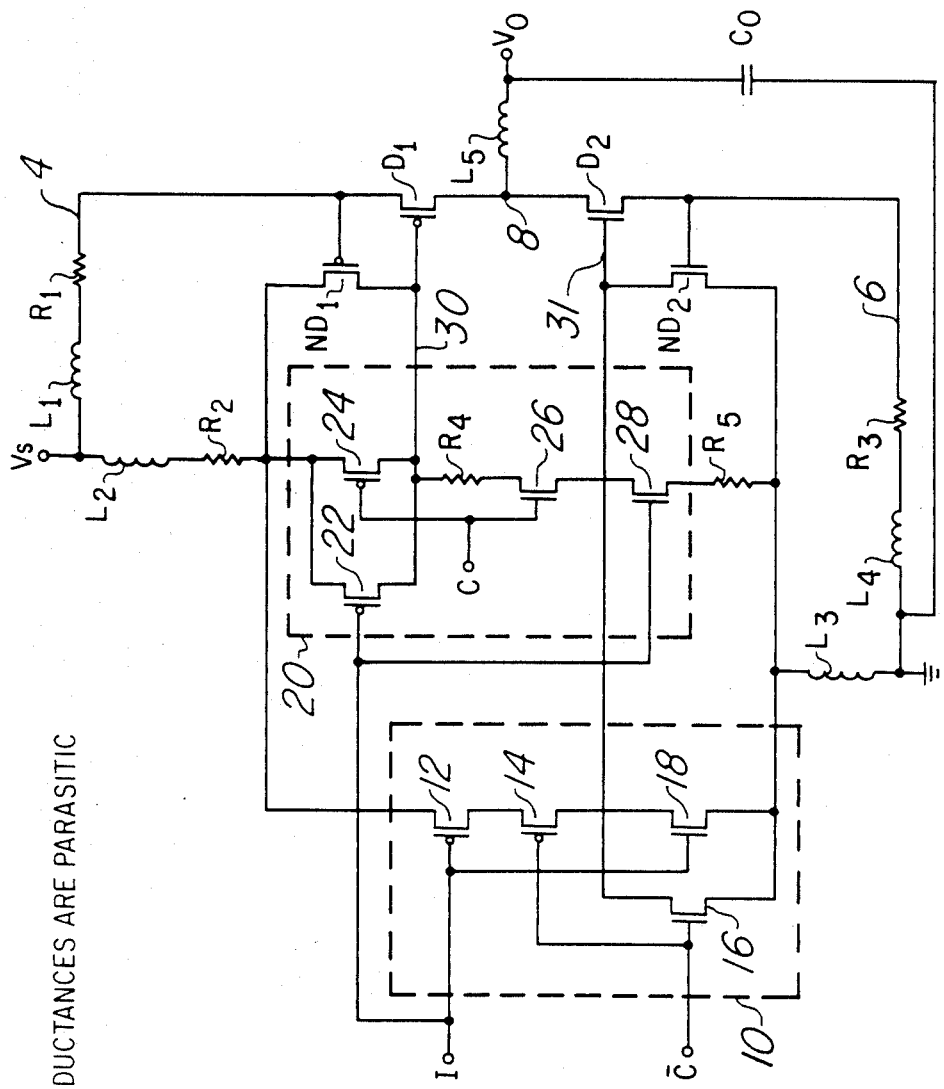
FIG. 3 is a schematic diagram of the output driver.

The foregoing fixed and variable or selective resistance features are shown together in the embodiment of FIG. 3. A digital data signal I is input to control logic circuits 10, 20. An optional enable signal C and its complementary signal $\overline{C}$ are respectively connected to the control logic circuits 10, 20. The control logic circuits 10, 20 are so configured that D1 and D2 are at opposite states and the output at 8 is changed by switching the states of D1 and D2. Control circuit 10 comprises two pair of CMOS transistors 12, 14, 16, 18; control circuit 20 comprises two pair of CMOS transistors 22, 24, 26, 28 plus optional resistor R4. A low level output (data signal high) signal is applied to line 30 to turn on the gate of D1 and charge the capacitive load Co to the desired high output logic level Voh. Control circuit 10 keeps D2 off. In contrast, a high level output signal (data signal low) will turn D2 on and control circuit 20 will turn D1 off.

When the output at 8 changes from high to low, current will flow from the capacitive output Co through L5, D2, R3, and L4 to ground. Parasitic inductors L5, L4 will generate a voltage in opposition to the discharging current in accordance with the characteristics of an inductor, $V = L\, di/dt$. Voltage developed on fixed resistance R3 will reduce di/dt and will dampen the anticipated oscillations generated by the LC combination of the load capacitance Co and the lead inductances L5, L4. Sensor device ND2 has its gate connected to ground line 6 that is carrying the discharge current. As the voltage on line 6 increases and exceeds a predetermined value, ND2 turns on. When ND2 is on, line 31 and the gate of D2 will be pulled to a level between Vs and ground. The current passing through D2 is proportional to the voltage on its gate. By reducing that voltage from its fully conductive level to the conductive level established by ND2 the flow of current is restricted. The latter has the effect of reducing oscillations on output node 8 and power supply node 6. When the output changes from low to high the foregoing operation is performed on the driver D1 using the sensor device ND1. Optional resistor R4 is provided to enhance the effect of sensor ND1. R4 may be disposed as shown or located in the position show between transistor 28 and line 32 (R5).

Having thus described the preferred embodiments of the invention, it will be appreciated by those skilled in the art that various changes and modifications may be made to the invention without departing from the spirit and scope of the following claims.

We claim:

1. A logic driver for compensating for the effects of parasitic inductance comprising:
   means for receiving a logic signal of one current level;
   means for generating an output current at another current level;
   control logic means connected between said receiving means and said current generating means and adapted to change the output current in accordance with the received logic signal;

voltage altering means connected between a potential source and said means for receiving a logic signal and between said potential source and said means for generating an output current, for altering the effects of a voltage produced by parasitic inductance.

2. The driver of claim 1 wherein the voltage altering means comprises a resistance.

3. The driver of claim 1 wherein the voltage altering means comprises a controlled resistance adapted to change its resistance in accordance with the voltage produced by the parasitic inductance.

4. The driver of claim 3 wherein the controlled resistance comprises a transistor.

5. The driver of claim 4 wherein the transistor is operable at a predetermined voltage produced by said parasitic inductance to increase the resistance connected to said inductance.

6. The driver of claim 1 wherein the voltage altering means comprises a fixed resistance and a voltage variable resistance.

7. The driver of claim 6 wherein the voltage variable resistance comprises a transistor.

8. The driver of claim 7 wherein the transistor changes its resistance in accordance with a predetermined voltage produced by the parasitic inductance.

9. An output driver for compensating for the effects of inherent inductance comprising:
   means for receiving an input signal comprising a series of alternate high and low logic levels,
   a pair of drivers connected to a supply potential, one for driving an output load at one current level in response to said high signals, the other for driving an output load at another current level in response to said low signals,
   control logic means for directing said high input signals to said high output driver and for directing said low output signals to said low output driver,
   means connected between said supply potential and said output drivers for increasing the resistance of said drivers and thereby reducing the rate of increased voltage by said inherent inductance.

10. The invention of claim 9 wherein the means connected between said supply potential and said output drivers is a fixed resistance.

11. The invention of claim 10 wherein the means connected between said supply potential and said output drivers is a variable resistance.

12. The invention of claim 9 wherein the means connected between said supply potential and said output drivers includes a fixed and a variable resistance.

13. The invention of claim 9 wherein the output drivers comprise a pair of transistors, each having a control electrode for controlling the resistance of the transistor to the passage of current through said transistor in accordance with the voltage on said control electrode and the means connected between said supply potential and said drivers comprises a further pair of transistors.

14. The invention of claim 13 wherein each of the further pair of transistors comprises a control electrode coupled to the voltage generated by said inductance and a further electrode connected to the control electrode of one of the drivers for reducing the voltage on the control electrode of the driver when the voltage generated by the inductance exceeds a predetermined level.

15. A method for driving a logic signal comprising:
    receiving a logic signal of one current level,
    generating a current at an output at a another current level,
    changing the current at the output in accordance with the logic level of the received signal,
    coupling the output current to the output, said coupling producing a parasitic voltage opposed to the flow of the output current, and
    reducing the magnitude of the parasitic voltage.

16. The method of claim 15 wherein the step of reducing further comprises selectively varying a resistance to the parasitic inductance.

17. The method of claim 16 wherein the step of selectively increasing the resistance comprises momentarily interrupting said generating.

18. A control circuit for preventing excessive power signal variation due to parasitic inductance associated with an output transistor whose conduction path is connected in series across a power supply potential and an output terminal, comprising:
    control logic means coupled to said power supply potential and said output transistor and adapted to change an output of said output transistor in accordance with a received logic signal;
    isolation means for providing isolation between a first potential supply node in said output transistor conduction path and a second potential supply node to said control logic means; and
    sensing means for sensing potential differences between said first and second power supply nodes and operatively coupled for momentarily turning off said output transistor in response to a desired potential difference.

19. The control circuit of claim 18 wherein said parasitic inductance is disposed in series with said first potential supply node and said power supply potential, and in series with said power supply potential and said second potential supply node.

20. The control circuit of claim 18, further comprising:
    means for preventing turning on of said output transistor until said sensing means ceases turning off said output transistor.

21. The control circuit of claim 18 wherein said isolation means comprises first resistance means disposed between said power supply potential and said first power supply node and second resistance means disposed between said power supply potential and said second power supply node.

22. The control circuit of claim 18 wherein,
    said control logic means comprises a NAND gate,
    said sensing means comprises a transistor,
    said isolation means comprises first resistance means disposed between said power supply potential and said first potential supply node and second resistance means disposed between said power supply potential and said second potential supply node.

23. The control circuit of claim 22 wherein said NAND gate is composed of a plurality of active devices and at least one resistive element disposed in a discharge path of said output transistor such to prevent turning on of said output transistor until said sensing means ceases turning off said output transistor.

24. An output driver control circuit, comprising:
    an output stage including
    a first drive transistor for clamping the output at a first output level, and
    a second drive transistor for clamping the output at a second output level;

a first control logic means coupled to a power supply potential and said first drive transistor and adapted to change the output of said first drive transistor in accordance with a received logic signal;

second control logic means coupled to said power supply potential and said second drive transistor and adapted to change an output of said second transistor in accordance with a received logic signal;

isolation means for isolating a first potential supply node of said first drive transistor from a second potential supply node of said first control means and for isolating a third potential supply node of said second drive transistor from a forth potential supply node of said second control means;

first sensing means for sensing potential differences between said first and second potential supply nodes;

second sensing means for sensing potential differences between said third and forth potential supply nodes;

said first and second sensing means operatively coupled for respectively turning off said respective first and second drive transistors in response to desired potential differences.

25. The output driver control circuit of claim 24 wherein said first control logic means comprises a NAND gate, said second control logic means comprises a NOR gate, said first and second sensing means comprise first and second transistors, said first and second isolation means comprise first and second resistance means.

26. The output driver control circuit of claim 25 further, comprising:

first means for preventing turning on of said first drive transistor until said first sensing means ceases turning off said first output transistor; and second means for preventing turning on of said second drive transistor until said second sensing means ceases turning off said second output transistor.

* * * * *